US010795474B2

United States Patent
Bu et al.

(10) Patent No.: US 10,795,474 B2
(45) Date of Patent: Oct. 6, 2020

(54) TOUCH CONTROL PANEL, PRODUCTION METHOD THEREOF, AND DISPLAY APPARATUS

(71) Applicant: BOE Technology Group Co., Ltd., Beijing (CN)

(72) Inventors: Dejun Bu, Beijing (CN); Pao Ming Tsai, Beijing (CN); Zhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/165,685

(22) Filed: Oct. 19, 2018

(65) Prior Publication Data
US 2019/0286266 A1    Sep. 19, 2019

(30) Foreign Application Priority Data
Mar. 15, 2018   (CN) .......................... 2018 1 0212774

(51) Int. Cl.
*G06F 3/041*     (2006.01)
*H01L 27/32*     (2006.01)
*H01L 51/00*     (2006.01)
*G02B 5/30*      (2006.01)

(52) U.S. Cl.
CPC .......... *G06F 3/0412* (2013.01); *H01L 27/323* (2013.01); *H01L 51/0097* (2013.01); *G02B 5/3025* (2013.01); *G06F 2203/04102* (2013.01); *G06F 2203/04103* (2013.01)

(58) Field of Classification Search
CPC . G06F 2203/04103; G06F 2203/04102; G06F 3/044; G06F 3/041; G06F 3/0412
See application file for complete search history.

(56) References Cited

U.S. PATENT DOCUMENTS

| 8,624,867 B2 | 1/2014 | Tamaki et al. |
| 9,448,654 B2 | 9/2016 | Liu et al. |
| 2010/0194709 A1 | 8/2010 | Tamaki et al. |
| 2012/0241198 A1* | 9/2012 | Kajiya ................. G06F 3/0412 174/250 |

(Continued)

FOREIGN PATENT DOCUMENTS

| CN | 101794036 A | 8/2010 |
| CN | 103309536 A | 9/2013 |

(Continued)

OTHER PUBLICATIONS

Office Action issued in corresponding Chinese Patent Application No. 201810212774.9, dated Aug. 20, 2020.

*Primary Examiner* — Md Saiful A Siddiqui
(74) *Attorney, Agent, or Firm* — McDermott Will & Emery LLP

(57) ABSTRACT

There is provided a display apparatus and a production method thereof. The display apparatus has a touch control panel and a display panel, wherein at least one surface of the touch control panel has a plurality of concave-convex fine structures, and wherein the touch control panel is on a light-emitting side of the display panel. The touch control panel may have: a flexible substrate having a plurality of concave-convex fine structures on at least one surface; and a touch control electrode having at least one part formed on one or more concave-convex fine structures of the flexible substrate.

11 Claims, 2 Drawing Sheets

(56) References Cited

U.S. PATENT DOCUMENTS

| | | | |
|---|---|---|---|
| 2013/0100053 A1* | 4/2013 | Kang | G06F 3/041 |
| | | | 345/173 |
| 2014/0098420 A1* | 4/2014 | Chung | G02B 27/286 |
| | | | 359/489.07 |
| 2014/0166993 A1* | 6/2014 | Leu | H01L 51/5268 |
| | | | 257/40 |
| 2014/0293162 A1* | 10/2014 | Park | G02F 1/133502 |
| | | | 349/12 |
| 2015/0062467 A1* | 3/2015 | Kang | G06F 3/0412 |
| | | | 349/12 |
| 2015/0109238 A1* | 4/2015 | Chen | G06F 3/046 |
| | | | 345/174 |
| 2015/0253912 A1 | 9/2015 | Liu et al. | |
| 2017/0075476 A1 | 3/2017 | Kwon et al. | |
| 2017/0348943 A1* | 12/2017 | Kajiya | B32B 7/02 |

FOREIGN PATENT DOCUMENTS

| | | |
|---|---|---|
| CN | 106249975 A | 12/2016 |
| CN | 107315507 A | 11/2017 |
| CN | 107329627 A | 11/2017 |
| EP | 3650998 A1 | 5/2020 |

\* cited by examiner

TOUCH CONTROL PANEL, PRODUCTION METHOD THEREOF, AND DISPLAY APPARATUS

CROSS-REFERENCE TO RELATED APPLICATION

This disclosure claims the priority of Chinese Patent Application No. 201810212774.9 filed on Mar. 15, 2018, which is incorporated herein in its entirety by reference.

TECHNICAL FIELD

This disclosure relates to the field of touch control display. Specifically, this disclosure relates to a display apparatus and a production method thereof.

BACKGROUND ART

With respect to an existing flexible touch control display panel, film layers such as a cover film, a touch screen panel (TSP) comprising a flexible substrate and a touch control electrode, an optically clear adhesive layer (OCA), a circular polarizer (CPOL), a bottom film, and the like, are sequentially stacked. When a flexible screen control display panel is folded, phenomena, such as bubbles in OCA, cracking, and layer separation, are prone to occur between the TSP and other film layers, particularly in an area where it is folded, due to the stress present between film layers. In a severe case, the cover film will be broken.

At present, the adhesiveness between the TSP and the film layers of the flexible touch control display panel will be enhanced and the overall stress level will be reduced, typically by increasing the thickness of the OCA, so as to reduce the stress received by the cover film. However, the increase in the thickness of the OCA layer will inevitably deteriorate the overall resilience property of the flexible touch control display panel.

SUMMARY OF THE INVENTION

Therefore, it desirable to provide a touch control panel in which the capability of bending resistance of a foldable display module may be improved overall, as well as a production method thereof and a display apparatus.

In one aspect, this disclosure provides a display apparatus, comprising:

a touch control panel, wherein at least one surface of the touch control panel has a plurality of concave-convex fine structures, and a display panel, wherein the touch control panel is on a light-emitting side of the display panel.

According to one embodiment of this disclosure, the display panel and one surface of the touch control panel having the concave-convex fine structures are bonded by an optically clear adhesive layer.

According to one embodiment of this disclosure, the display apparatus further comprises a circular polarizer, wherein the circular polarizer and one surface of the touch control panel having the concave-convex fine structures are bonded by an optically clear adhesive layer.

According to one embodiment of this disclosure, wherein the circular polarizer is located on a side of the touch control panel away from the display panel.

According to one embodiment of this disclosure, either of both surfaces of the touch control panel has the plurality of concave-convex fine structures.

According to another embodiment of this disclosure, the concave-convex fine structure is a nanoscale to microscale concave-convex fine structure, and a distance between two adjacent concave-convex fine structures is 200 nm to 5 μm in the plurality of concave-convex fine structures.

According to another embodiment of this disclosure, a distance between two adjacent concave-convex fine structures is less than 380 nm in the plurality of concave-convex fine structures.

According to another embodiment of this disclosure, the concave-convex fine structure has a height of 50 nm to 50 μm.

According to another embodiment of this disclosure, the concave-convex fine structures are uniformly provided on a surface of the touch control panel.

According to another embodiment of this disclosure, the touch control panel comprises: a flexible substrate, wherein at least one surface of the flexible substrate has a plurality of concave-convex fine structures; and a touch control electrode, wherein at least one part of the touch control electrode is formed on one or more concave-convex fine structures of the flexible substrate.

According to one embodiment of this disclosure, an orthographic projection area of the touch control electrode on the flexible substrate is less than a surface area of the touch control electrode.

According to another embodiment of this disclosure, either of both surfaces of the flexible substrate has a plurality of concave-convex fine structures.

According to another embodiment of this disclosure, the touch control electrode is formed on the both surfaces of the flexible substrate.

According to another embodiment of this disclosure, the touch control electrode is a single-layer-mode touch control electrode and comprises a plurality of first touch control electrodes arranged in a first direction and a plurality of second touch control electrodes arranged in a second direction, wherein the first direction is different from the second direction. For example, the first direction is perpendicular to the second direction.

According to another embodiment of this disclosure, the touch control electrode is a double-layer-mode touch control electrode and comprises a plurality of first touch control electrodes arranged in a first direction on one surface of the flexible substrate and a plurality of second touch control electrodes arranged in a second direction on the other surface of the flexible substrate, wherein the first direction is different from the second direction. For example, the first direction is perpendicular to the second direction.

According to another embodiment of this disclosure, the flexible substrate comprises a first flexible substrate and a second flexible substrate, wherein a plurality of first touch control electrodes arranged in a first direction are provided on the first flexible substrate; and a plurality of second touch control electrodes arranged in a second direction are provided on the second flexible substrate, wherein the first direction is different from the second direction. For example, the first direction is perpendicular to the second direction.

According to another embodiment of this disclosure, the flexible substrate comprises inorganic oxide particles with a particle size of 1 nm to 200 nm.

According to another embodiment of this disclosure, the display panel is an organic electroluminescent display panel.

According to another embodiment of this disclosure, the flexible substrate has a thickness of 20 nm to 100 μm.

According to another embodiment of this disclosure, the concave-convex fine structure is in a pyramid shape or a spherical cap shape, and has a slope angle of less than or equal to 45°.

In another aspect of this disclosure, there is provided a method for producing the display apparatus described above, comprising the following steps for producing a touch control panel: forming a conductive material layer on at least one surface of a flexible substrate, wherein the at least one surface of the flexible substrate has a plurality of concave-convex fine structures; and patterning the conductive material layer to form a touch control electrode so that at least one part of the touch control electrode is formed on one or more concave-convex fine structures of the flexible substrate.

According to one embodiment of this disclosure, the flexible substrate is formed on a support plate having a plurality of concave-convex fine structures on a surface thereof by a concave-convex template method, and is then peeled off from the support plate to obtain a flexible substrate having a plurality of concave-convex fine structures at least on a surface in contact with the support plate.

According to another embodiment of this disclosure, the flexible substrate has a thickness of 20 nm to 50 nm, and the flexible substrate is formed on a support plate having a plurality of concave-convex fine structures on a surface thereof by a concave-convex template method, and is then peeled off from the support plate to obtain a flexible substrate having a plurality of concave-convex fine structures on either of two surfaces.

According to another embodiment of this disclosure, the plurality of concave-convex fine structures of the surface of the flexible substrate are formed by photolithography, micro-nanoscale imprinting, or physical friction.

DESCRIPTION OF DRAWINGS

In order to illustrate the technical solutions in examples of this disclosure more clearly, figures required for describing the examples will be simply introduced below. It is apparent that the figures described below are merely exemplary examples of this disclosure, and other figures may be further obtained by those of ordinary skill in the art according to these figures without exerting inventive work.

DESCRIPTION OF EMBODIMENTS

Figure 1:
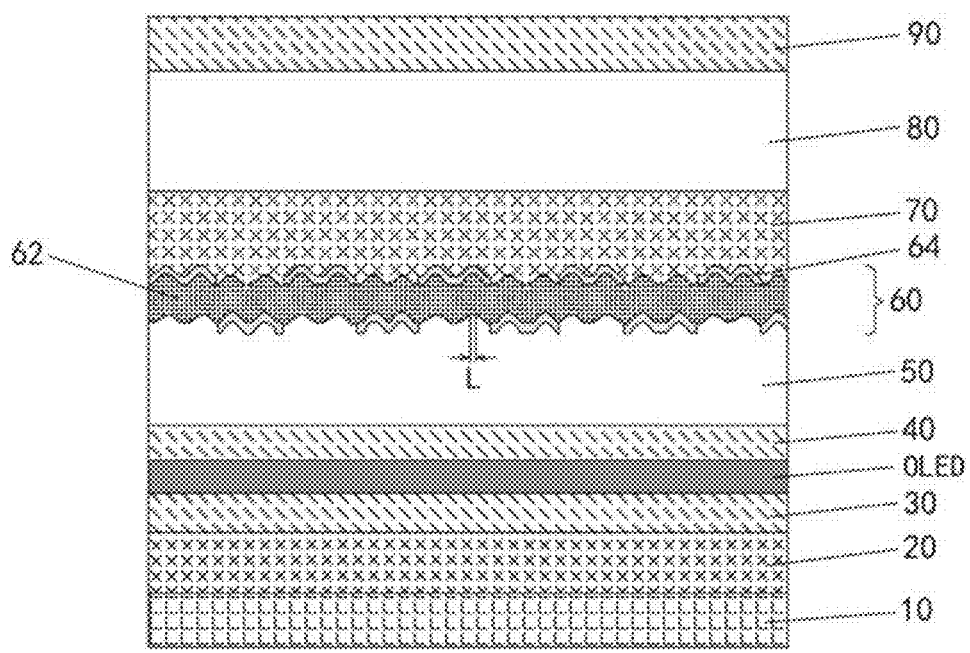
FIG. 1 is a schematic view exemplarily illustrating a display apparatus according to one embodiment of this disclosure.

The technical solutions in the examples of this disclosure will be described clearly and fully below in conjunction with specific embodiments of this disclosure. Obviously, the embodiments and/or examples described are merely a part of the embodiments and/or examples of this disclosure, rather than all of the embodiments and/or examples. Based on the embodiments and/or examples of this disclosure, all other embodiments and/or examples obtained by those of ordinary skill in the art without performing inventive work belong to the scope protected by this disclosure.

In this disclosure, the layer and the film may be interchangeably used, unless specifically indicated. In this disclosure, all characteristics of numeric values mean to be within an error range of measurement, for example within ±10%, within ±5%, or within ±1% of a defined numeric value. Terms "first", "second", "third", and the like are for the purpose of description only, and cannot be understood as indicating or suggesting relative importance or implying the number of technical features indicated. Thereby, a characteristic defined by "first", "second", "third", and the like may expressly or impliedly comprises one or more characteristics.

In one aspect of this disclosure, there may be provided a display apparatus, comprising: a touch control panel, wherein at least one surface of the touch control panel has a plurality of concave-convex fine structures, and a display panel, wherein the touch control panel is on a light-emitting side of the display panel.

The concave-convex fine structure stated herein refers to a fine concave and/or convex part on a surface. One concave-convex fine structure may be only a concave part, may be only a convex part, or may comprise both a concave part and a convex part simultaneously. The concave part and the convex part stated herein are relative to a flat surface as a reference. The dimension in the height direction (i.e., along the normal direction of the surface) of a concave-convex fine structure is larger than the natural roughness of a flat touch control panel surface. The height of a concave-convex fine structure, i.e., the height difference between the highest point and the lowest point in a concave-convex fine structure, may be 50 nm to 50 μm, for example. The dimensions in the lateral direction (i.e., along the tangential direction of the surface) of fine concave parts and convex parts are smaller than the natural undulation of a surface. The dimension in the lateral direction of a concave-convex fine structure may be on the order of nanometers to micrometers. The dimension in the lateral direction/diameter of a concave-convex fine structure may be 200 nm to 50 μm, for example. Adjacent concave-convex fine structures may be disconnected. Optionally, the distance between two adjacent concave-convex fine structures may be 200 nm to 5 μm, for example. However, adjacent concave-convex fine structures may also be continuous.

The surface of the touch control panel having a plurality of concave-convex fine structures in the display apparatus may be used to be bonded to other parts (for example, a display device, a cover film, a circular polarizer, and the like) in the display apparatus to form a touch control display apparatus. Since this surface has a larger area compared to a flat surface, it is favorable to increase the adhesion effect and may also reduce the overall stress level when bended.

Optionally, the display panel and one surface of the touch control panel having the concave-convex fine structures are bonded by an optically clear adhesive layer. Such structure may prevent bubbles in OCA, cracking, and layer separation between the display panel and the touch control panel.

Optionally, the display apparatus further comprises a circular polarizer, wherein the circular polarizer and one surface of the touch control panel having the concave-convex fine structures are bonded by an optically clear adhesive layer. Such structure may prevent bubbles in OCA, cracking, and layer separation between the circular polarizer and the touch control panel.

Optionally, the circular polarizer is located on a side of the touch control panel away from the display panel. Thereby, the display panel may be bonded to the other surface of the touch control panel.

Optionally, either of both surfaces of the touch control panel has the plurality of concave-convex fine structures. The both surfaces may be used to be bonded to parts on both sides, respectively.

Particularly, the touch control panel in the display apparatus of this disclosure is a flexible touch control panel. The flexible touch control panel may better endure bending when used in a flexible touch control display apparatus, and the fine concave-convex structure on its surface may effectively reduce the stress, so as to reduce bubbles in OCA, cracking, and layer separation. Hereinafter, this disclosure will be illustrated with a flexible touch control panel and a flexible display apparatus sometimes. However, this disclosure may also be used in partly flexible or non-flexible cases.

Optionally, the touch control panel in the display apparatus comprises:

a flexible substrate, wherein at least one surface of the flexible substrate has a plurality of concave-convex fine structures; and a touch control electrode, wherein at least one part of the touch control electrode is formed on one or more concave-convex fine structures of the flexible substrate.

Here, the concave-convex fine structure of the flexible substrate may correspond to the concave-convex fine structure on the surface of the touch control panel. This correspondence includes but is not limited to the following forms. The surface of the flexible substrate having a concave-convex fine structure per se is the surface of the touch control panel, so that the concave-convex fine structure on the surface of the touch control panel is the concave-convex fine structure on the surface of the flexible substrate and a concave-convex fine structure thereon formed by the touch control electrode having the same shape as that of the concave-convex fine structure on the surface of the flexible substrate. Otherwise, the surface of the flexible substrate having a concave-convex fine structure and the touch control electrode thereon are covered with an additional layer such as a protective layer, and this layer has a substantially uniform thickness and is used as the surface of the touch control panel, so that the surface of the touch control panel has a concave-convex fine structure having a shape substantially consistent with that of the concave-convex fine structure of the flexible substrate. The layer described above may also be a multilayer structure, as long as the outer surface of the touch control panel has a corresponding concave-convex fine structure. The corresponding concave-convex fine structure comprises completely the same structure, but may also comprise a structure having substantially the same shape and size.

In the description below, the flexible substrate having a plurality of concave-convex fine structures on at least one surface is also referred to as a flexible concave-convex substrate sometimes; and the surface having a plurality of concave-convex fine structures is also referred to as a concave-convex surface sometimes.

FIG. 1 is a schematic view exemplarily illustrating a flexible touch control panel and a flexible display apparatus according to one embodiment of this disclosure.

As shown in FIG. 1, a flexible display apparatus may comprise a bottom film 10, a flexible substrate 20 such as a polyimide (PI) substrate on the bottom film 10, a thin-film transistor (TFT) 30 on the flexible substrate 20, an organic light-emitting diode (OLED) on the TFT 30, a thin-film encapsulating layer (TFE) 40 on the OLED, a first optically clear adhesive layer (OCA) 50 on the TFE 40, a flexible touch control panel 60 (the flexible touch control panel 60 comprises a flexible concave-convex substrate 62 and a touch control electrode 64) on the first OCA 50, a circular polarizer (CPOL) 70 on the touch control panel 60, a second optically clear adhesive layer (OCA) 80 on the CPOL 70, and a cover layer 90 on the second OCA 80. In FIG. 1, the circular polarizer 70 is located on the touch control panel 60, but the circular polarizer 70 may also be located under the touch control panel 60.

In FIG. 1, as exemplified, the flexible concave-convex substrate 62 has a plurality of concave-convex fine structures on both upper and lower surfaces. That is, as exemplified, the flexible concave-convex substrate 62 has concave-convex upper and lower surfaces, and touch control electrodes 64 are formed on the concave-convex fine structures on upper and lower surfaces of the flexible concave-convex substrate 62. Therefore, the capability of bending resistance of a foldable display module may be further improved overall. However, this disclosure is not limited thereto. For example, when either surface of upper and lower surfaces of the flexible concave-convex substrate 62 has a plurality of concave-convex fine structures, a touch control electrode 64 may be formed on the surface having a plurality of concave-convex fine structures, or touch control electrodes 64 may be formed on both upper and lower surfaces. For further example, in the case where both upper and lower surfaces of the flexible concave-convex substrate 62 have a plurality of concave-convex fine structures, the touch control electrode 64 may also be formed on either one of the two surfaces only.

In FIG. 1, an OLED is exemplified. However, this disclosure may also be used in a liquid crystal display device (LCD) or other display devices.

The flexible concave-convex substrate 62 as shown in FIG. 1 may be produced by a concave-convex template method. Specifically, a solution of a material of a flexible substrate may be coated on a support plate having concave-convex fine structures on the upper surface, and the solvent is removed. By controlling the coating amount for example allowing the thickness of a flexible concave-convex substrate 62 is 20 nm to 50 nm after drying, the upper surface of the flexible concave-convex substrate 62 may be allowed to adaptively have concave-convex fine structures corresponding to the upper surface of the support plate. The flexible concave-convex substrate 62 is then peeled off from the support plate to obtain the flexible concave-convex substrate 62. In the case where the thickness of the flexible concave-convex substrate 62 is, for example, 20 μm to about 100 μm after drying, the flexible concave-convex substrate 62 having a plurality of concave-convex fine structures on the surface in contact with the support plate and a smooth plane on the surface not in contact with the support plate may be obtained.

The flexible concave-convex substrate 62 may also be produced by photolithography, micro-nanoscale imprinting, or physical friction. Specifically, a solution of a material of a flexible substrate is coated on a smooth support plate and the solvent is removed to form a smooth flexible concave-convex substrate 62. The upper surface and/or the lower surface of the originally smooth flexible concave-convex substrate 62 are allowed to have concave-convex fine structures by using a method, such as photolithography, micro-nanoscale imprinting, physical friction, and the like.

In FIG. 1, the orthographic projection area of the touch control electrode 64, which has at least one part formed on one or more concave-convex fine structures of the flexible concave-convex substrate 62, on the flexible concave-convex substrate 62 is less than the surface area of the touch control electrode 64, so that the electrical properties of the material of the touch control electrode per unit projection area is more excellent and thereby the effect of touch control of the touch control panel 60 may be improved.

As described above, the flexible concave-convex substrate 62 may be produced by coating a solution or dispersion of the material of the flexible substrate on a support plate and drying it.

The material of the flexible substrate may include, for example, polyethylene terephthalate (PET), polyethylene naphthalate (PEN), cycloolefin polymer (COP), polyimide (PI), poly carbonate (PC), and the like.

In the production process of the flexible concave-convex substrate 62, inorganic oxide particles such as titanium oxide, zirconium oxide, silicon oxide, aluminum oxide, other oxide particles, or any combination of those described above, may be added to the solution or dispersion of the material of the flexible substrate and dispersed therein. The flexible concave-convex substrate 62 may comprise inorganic oxide particles in an amount of greater than 0 and less than or equal to 20% by weight. The size of the inorganic oxide particle may be 1 nm to 200 nm. On the one hand, the inorganic oxide particle may further increase gas barrier rate, moisture barrier rate, and transmission rate of the flexible concave-convex substrate 62. On the other hand, the inorganic oxide particle may contribute to the formation of concave-convex fine structures on the surface of the flexible concave-convex substrate 62.

The concave-convex fine structure on the surface of the flexible concave-convex substrate 62 may be a nanoscale to microscale concave-convex fine structure. The distance L between two adjacent concave-convex fine structures may be 200 nm to 5 μm, so that a suitable number of concave-convex fine structures may be formed on the surface of the flexible concave-convex substrate 62.

The distance between two adjacent concave-convex fine structures may be less than 380 nm, so that these concave-convex fine structures may have antireflective properties due to continuous changes of refractive indices in the concave-convex fine structures.

The height of the concave-convex fine structure may be 50 nm to 50 μm.

The concave-convex fine structure may include a spherical cap shape, a pyramid shape, a bucket shape, a rectangular shape, and a trapezoidal shape.

The concave-convex fine structure may be selected from a spherical cap shape, a pyramid shape, or a bucket shape, and the diameter of its orthographic projection area on the flexible concave-convex substrate 62 is 200 nm to 50 μm. Alternatively, the concave-convex fine structure may be selected from a rectangular shape or a trapezoidal shape, and the length and the width of its orthographic projection area on the flexible concave-convex substrate 62 are each 200 nm to 50 μm. The concave-convex fine structures may be uniformly provided on the flexible concave-convex substrate 62, so that touch control electrodes may be uniformly formed thereon and the properties of the touch control electrodes are thereby allowed to be uniform.

The thickness of the flexible concave-convex substrate 62 may be 20 nm to 100 μm.

The thickness of the touch control electrode 64 may range from 100 nm to 5 μm.

By setting the height of the concave-convex fine structure in a range of 50 nm to 50 μm and the shape thereof, a touch control electrode having a thickness in a range of 100 nm to 5 μm may be conveniently thereon, so that the capability of bending resistance of a foldable display module may be improved overall.

The concave-convex fine structure may be in a pyramid shape or a spherical cap shape, and may have a slope angle of less than or equal to 45°.

In another aspect of this disclosure, there may be provided a method for producing the display apparatus of any one described above, comprising the following steps for producing a touch control panel:

forming a conductive material layer on at least one surface of a flexible concave-convex substrate 62, wherein the at least one surface of the flexible concave-convex substrate 62 has a plurality of concave-convex fine structures; and patterning the conductive material layer to form a touch control electrode 64 so that at least one part of the touch control electrode 64 is formed on one or more concave-convex fine structures of the flexible concave-convex substrate 62.

Furthermore, after the touch control electrode 64 is formed, a protective layer may be formed thereon to cover the touch control electrode 64 and a part of the flexible concave-convex substrate 62 which is not covered by the touch control electrode 64. In the presence of the protective layer, the thickness of the protective layer may be selected so that the upper surface thereof adaptively has a surface morphology corresponding to a part covered thereby (i.e., a concave-convex morphology).

The method for producing the display apparatus also comprises steps for assembling other parts of the display apparatus, such as the display panel, the cover film, and the like, to the touch control panel. The parts adjacent to the touch control panel may be bonded thereto by an optically clear adhesive layer. In this case, on the surface of the touch control panel having the concave-convex fine structures, phenomena, such as bubbles in OCA, cracking, and layer separation, may be prevented effectively.

In FIG. 1, the touch control electrode 64 is formed on the both concave-convex surfaces of the flexible concave-convex substrate 62, and therefore the touch control panel 60 formed is a touch control panel 60 composed of a double-layer-mode touch control electrode 64 layer.

Additionally, as described above, the touch control electrode 64 may be formed on a concave-convex surface, such as the upper concave-convex surface, of the flexible concave-convex substrate 62, while the touch control electrode 64 is not present on the lower surface of the flexible concave-convex substrate 62. Therefore, it may be a touch control panel 60 composed of a single-layer-mode touch control electrode 64 layer. In this case, the lower surface of the flexible concave-convex substrate 62 may be a concave-convex surface or a smooth surface. In the case where the lower surface of the flexible concave-convex substrate 62 is a concave-convex surface, the capability of bending resistance of a foldable display module may be further improved overall.

However, this disclosure is not limited thereto. The touch control electrode 64 may also be present on the lower smooth surface of the flexible concave-convex substrate 62. Therefore, it may also be a touch control panel 60 composed of a double-layer-mode touch control electrode 64 layer.

Furthermore, a flexible touch control panel having a film-film structure may also be formed from two substrates, each of which has a single-layer-mode touch control electrode 64 layer.

Figure 2:
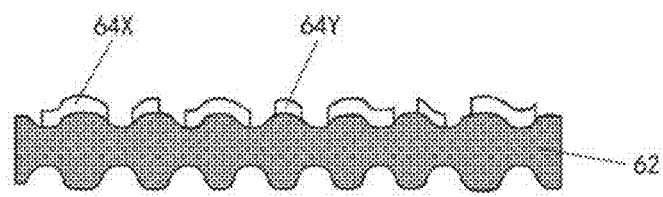
FIG. 2 is a partial schematic view exemplarily illustrating a touch control panel having a single-layer-mode transparent touch control conductive electrode layer according to one embodiment of this disclosure.

FIG. 2 is a partial schematic view exemplarily illustrating a flexible touch control panel having a single-layer-mode transparent touch control electrode layer according to one embodiment of this disclosure.

As shown in FIG. 2, a plurality of touch control electrodes 64X arranged in an X-axis direction and a plurality of touch control electrodes 64Y arranged in a Y-axis direction are provided on the flexible concave-convex substrate 62. The touch control electrodes 64X arranged in the X-axis direction and the touch control electrodes 64Y arranged in the Y-axis direction may be connected by respective bridging lines and electrically connected to an external circuit by leads, respectively, and may be separated from each other by insulating layers. A protective layer may also be provided on the touch control electrode 64.

The method for forming the touch control panel 60 having a structure as shown in FIG. 2 may comprise the steps of: sputtering/coating a transparent conductive material on the flexible concave-convex substrate 62 and forming a conductive wiring pattern (a plurality of touch control electrodes 64X arranged in an X-axis direction and a plurality of touch control electrodes 64Y arranged in a Y-axis direction); producing an insulating layer on the conductive wiring pattern; producing respective bridging lines for the touch control electrodes 64X and the touch control electrodes 64Y, respectively; and forming a protective layer.

Figure 3:
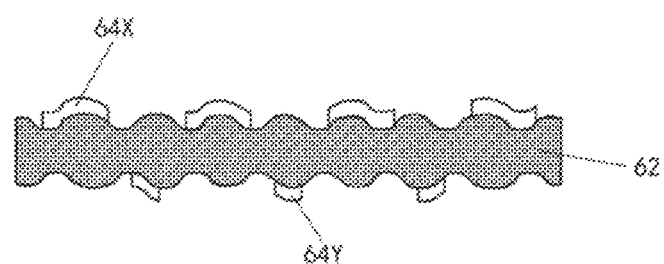
FIG. 3 is a partial schematic view exemplarily illustrating a touch control panel having a double-layer-mode transparent touch control conductive electrode layer according to one embodiment of this disclosure.

FIG. 3 is a partial schematic view exemplarily illustrating a flexible touch control panel having a double-layer-mode transparent touch control electrode layer according to one embodiment of this disclosure.

As shown in FIG. 3, a plurality of touch control electrodes 64X arranged in an X-axis direction are provided on the upper concave-convex surface of the flexible concave-convex substrate 62, and a plurality of touch control electrodes 64Y arranged in an Y-axis direction are provided on the lower concave-convex surface of the flexible concave-convex substrate 62. The touch control electrodes 64X arranged in the X-axis direction and the touch control electrodes 64Y arranged in the Y-axis direction may be electrically connected to an external circuit by leads, respectively. A protective layer may be provided on a surface of the touch control electrode 64 away from the flexible concave-convex substrate 62.

The method for forming the touch control panel 60 having a structure as shown in FIG. 3 may comprise the steps of: sputtering/coating transparent conductive materials on the upper surface and the lower surface of the flexible concave-convex substrate 62 respectively and forming X- and Y-axis conductive wiring patterns (a plurality of touch control electrodes 64X arranged in an X-axis direction and a plurality of touch control electrodes 64Y arranged in a Y-axis direction); and producing protective layers on the plurality of touch control electrodes 64X arranged in the X-axis direction and the plurality of touch control electrodes 64Y arranged in the Y-axis direction, respectively.

Figure 4:
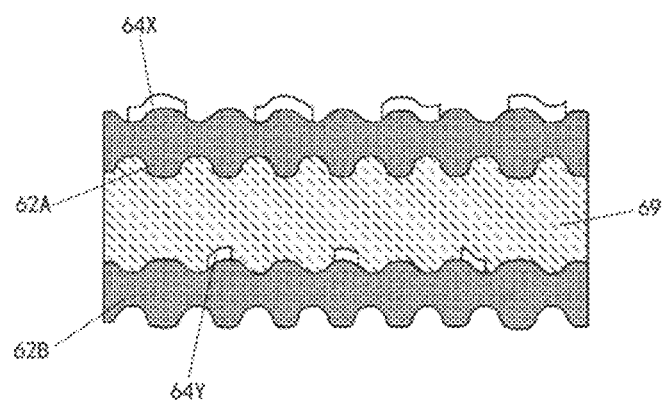
FIG. 4 is a partial schematic view exemplarily illustrating a touch control panel having a film-film (or F-F) structure according to one embodiment of this disclosure.

FIG. 4 is a partial schematic view exemplarily illustrating a flexible touch control panel having a film-film structure according to one embodiment of this disclosure.

As shown in FIG. 4, the flexible touch control panel comprises a first flexible concave-convex substrate 62A and a second flexible concave-convex substrate 62B. A plurality of touch control electrodes 64X arranged in an X-axis direction are provided on the upper concave-convex surface of the first flexible concave-convex substrate 62A. A plurality of touch control electrodes 64Y arranged in a Y-axis direction are provided on the upper concave-convex surface of the second flexible concave-convex substrate 62B. The touch control electrodes 64X arranged in the X-axis direction and the touch control electrodes 64Y arranged in the Y-axis direction are electrically connected to an external circuit by leads, respectively. A protective layer may be provided on a surface of the touch control electrode 64.

The first flexible concave-convex substrate 62A and the second flexible concave-convex substrate 62B, on each of which the touch control electrodes 64 and the protective layers are formed, are bonded together by a third optically clear adhesive layer (OCA) 69.

The method for forming the touch control panel 60 having a structure as shown in FIG. 4 may comprise the steps of: sputtering/coating a transparent conductive material on the upper concave-convex surface of the first flexible concave-convex substrate 62A and forming an X-axis conductive wiring pattern (a plurality of touch control electrodes 64X arranged in an X-axis direction); sputtering/coating a transparent conductive material on the upper concave-convex surface of the second flexible concave-convex substrate 62B and forming an Y-axis conductive wiring pattern (a plurality of touch control electrodes 64Y arranged in an Y-axis direction); producing protective layers on the plurality of touch control electrodes 64X arranged in the X-axis direction and the plurality of touch control electrodes 64Y arranged in the Y-axis direction, respectively; and bonding the first flexible concave-convex substrate 62A and the second flexible concave-convex substrate 62B, on which the touch control electrodes 64 and the protective layers are formed, together by a third optically clear adhesive layer 69.

In FIG. 2 to FIG. 4, the X-axis direction is different from the Y-axis direction. In one embodiment, the X-axis direction is perpendicular to the Y-axis direction.

The touch control electrode 64 may be formed from a transparent conductive material. The transparent conductive material may include, but not limited to, indium tin oxide (ITO), indium zinc oxide (IZO), metal nanowires, metal grids, PEDOT (poly(3,4-ethylenedioxythiophene)), carbon nanotubes (CNTs), or thin metal layers. Those described above may be used alone or in combination.

The bridging line for connecting the plurality of touch control electrodes 64X arranged in the X-axis direction or the plurality of touch control electrodes 64Y arranged in the Y-axis direction may be formed from a metal or a transparent conductive metal oxide. The metal may have a three-layer structure of Mo/Al/Mo. The transparent conductive metal oxide may include indium tin oxide (ITO), indium zinc oxide (IZO), and the like. The lead may have a three-layer structure of Mo/Al/Mo. The insulating layer may be formed from silicon oxide or silicon nitride. The protective layer may be formed from silicon oxide or silicon nitride.

As shown in FIG. 2 to FIG. 4, both upper and lower surfaces of the flexible concave-convex substrate 62 are concave-convex surfaces. However, this disclosure is not limited thereto. In the cases of FIG. 2 and FIG. 4, the lower surface of the flexible concave-convex substrate 62 may be a smooth surface. In the case of FIG. 3, either of upper and lower surfaces of the flexible concave-convex substrate 62 may be a smooth surface.

Additionally, as shown in FIG. 3, a plurality of touch control electrodes 64X arranged in an X-axis direction are provided on the upper concave-convex surface of the flexible concave-convex substrate 62, and a plurality of touch control electrodes 64Y arranged in an Y-axis direction are provided on the lower concave-convex surface of the flexible concave-convex substrate 62. However, this disclosure is not limited thereto. A plurality of touch control electrodes 64Y arranged in an Y-axis direction may be formed on the upper concave-convex surface of the flexible concave-convex substrate 62, and a plurality of touch control electrodes 64X arranged in an X-axis direction may be formed on the lower concave-convex surface of the flexible concave-convex substrate 62.

Additionally, as shown in FIG. 4, a plurality of touch control electrodes 64X arranged in an X-axis direction are provided on the upper concave-convex surface of the first flexible concave-convex substrate 62A, and a plurality of touch control electrodes 64Y arranged in an Y-axis direction are provided on the upper concave-convex surface of the second flexible concave-convex substrate 62B. However, this disclosure is not limited thereto. A plurality of touch control electrodes 64Y arranged in an Y-axis direction may be formed on the upper concave-convex surface of the first flexible concave-convex substrate 62A, and a plurality of touch control electrodes 64X arranged in an X-axis direction may be formed on the lower concave-convex surface of the second flexible concave-convex substrate 62B. Alternatively, a plurality of touch control electrodes 64X arranged in an X-axis direction may be provided on the upper concave-convex surface of the first flexible concave-convex substrate 62A, and a plurality of touch control electrodes 64Y arranged in an Y-axis direction may be provided on the lower concave-convex surface of the second flexible concave-convex substrate 62B; or a plurality of touch control electrodes 64Y arranged in an Y-axis direction may be provided on the upper concave-convex surface of the first flexible concave-convex substrate 62A, and a plurality of touch control electrodes 64X arranged in an X-axis direction may be provided on the lower concave-convex surface of the second flexible concave-convex substrate 62B. Alternatively, a plurality of touch control electrodes 64X arranged in an X-axis direction may be provided on the lower concave-convex surface of the first flexible concave-convex substrate 62A, and a plurality of touch control electrodes 64Y arranged in an Y-axis direction may be provided on the upper concave-convex surface of the second flexible concave-convex substrate 62B; or a plurality of touch control electrodes 64Y arranged in an Y-axis direction may be provided on the lower concave-convex surface of the first flexible concave-convex substrate 62A, and a plurality of touch control electrodes 64X arranged in an X-axis direction may be provided on the upper concave-convex surface of the second flexible concave-convex substrate 62B. Alternatively, a plurality of touch control electrodes 64X arranged in an X-axis direction may be provided on the lower concave-convex surface of the first flexible concave-convex substrate 62A, and a plurality of touch control electrodes 64Y arranged in an Y-axis direction may be provided on the lower concave-convex surface of the second flexible concave-convex substrate 62B; or a plurality of touch control electrodes 64Y arranged in an Y-axis direction may be provided on the lower concave-convex surface of the first flexible concave-convex substrate 62A, and a plurality of touch control electrodes 64X arranged in an X-axis direction may be provided on the lower concave-convex surface of the second flexible concave-convex substrate 62B.

In still another aspect of this disclosure, there may be provided a display apparatus comprising the touch control panel of any one described above.

According to one embodiment of this disclosure, the display apparatus may further comprise an organic electroluminescent display panel, wherein the touch control panel is provided on the light-emitting side of the organic electroluminescent display panel.

According to another embodiment of this disclosure, the display apparatus may further comprise a circular polarizer, wherein the circular polarizer is located on a side of the touch control panel away from the organic electroluminescent display panel.

By using the touch control panel, the production method thereof, and the display apparatus of this disclosure and increasing the specific surface area of the flexible substrate, in the case where the overall resilience of the touch control panel is not compromised, the contact area between the touch control panel and the optically clear adhesive layer may be increased to improve the adhesion effect therebetween while the overall stress level may be reduced, to reduce the stress received by the cover film due to bending. Phenomena occurring between the touch control panel and other film layers of the touch control display apparatus, such as bubbles in the optically clear adhesive layer, cracking, layer separation, and the like, are solved, so that the capability of bending resistance of a foldable display module is improved overall. Furthermore, by allowing the orthographic projection area of the touch control electrodes on the flexible substrate is less than the surface area of the touch control electrode, the electrical properties of the material of the touch control electrode in a unit projected area is more excellent and thereby the effect of touch control of the touch control panel may be improved.

Obviously, various modifications and variations may be made to the examples of this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A display apparatus, comprising:
   a touch control panel, wherein at least a lower surface of the touch control panel has a plurality of concave-convex fine structures; and
   a display panel,
   wherein the touch control panel comprises:
   a first flexible concave-convex substrate, wherein an upper surface and a lower surface of the first flexible concave-convex substrate both have a plurality of concave-convex fine structures;
   a second flexible concave-convex substrate below the first flexible concave-convex substrate, wherein the first flexible concave-convex substrate and the second flexible concave-convex substrate are bonded by a third optically clear adhesive layer, wherein an upper surface and a lower surface of the second flexible concave-convex substrate both have a plurality of concave-convex fine structures; and
   a touch control electrode, wherein the touch control electrode is a double-layer-mode touch control electrode and comprises a plurality of first touch control electrodes arranged in a first direction on one of the upper and lower surfaces of the first flexible concave-convex substrate and a plurality of second touch control electrodes arranged in a second direction on one of the upper and lower surfaces of the second flexible concave-convex substrate, wherein the first direction is different from the second direction, and orthogonal projections of the first touch control electrodes on the display panel and orthogonal projections of the second touch control electrodes on the display panel do not overlap, wherein the touch control panel is on a light-emitting side of the display panel, and wherein the display panel and the lower surface of the touch control panel are bonded by a first optically clear adhesive layer.

2. The display apparatus according to claim 1, wherein the display apparatus further comprises a circular polarizer, wherein the circular polarizer and an upper surface having the concave-convex fine structures of the touch control panel are bonded by a second optically clear adhesive layer.

3. The display apparatus according to claim 1, wherein each of both surfaces of the touch control panel has the plurality of concave-convex fine structures.

4. The display apparatus according to claim 1, wherein the concave-convex fine structure has a height of 50 nm to 50 µm.

5. The display apparatus according to claim 1, wherein the concave-convex fine structures are uniformly provided on a surface of the touch control panel.

6. The display apparatus according to claim 1, wherein the flexible substrate comprises inorganic oxide particles with a particle size of 1 nm to 200 nm.

7. The display apparatus according to claim 1, wherein the display panel is an organic electroluminescent display panel.

8. The display apparatus according to claim 1, wherein the concave-convex fine structure is a nanoscale to microscale concave-convex fine structure, and a distance between two adjacent concave-convex fine structures is 200 nm to 5 µm in the plurality of concave-convex fine structures.

9. The display apparatus according to claim 8, wherein a distance between two adjacent concave-convex fine structures is less than 380 nm in the plurality of concave-convex fine structures.

10. A method for producing the display apparatus of claim 1, comprising following steps for producing the touch control panel:
    forming a first conductive material layer on at least one surface of a first flexible concave-convex substrate, wherein an upper surface and a lower surface of the first flexible concave-convex substrate both have a plurality of concave-convex fine structures; and
    patterning the first conductive material layer to form a first touch control electrode so that at least one part of the first touch control electrode is formed on one or more concave-convex fine structures of the first flexible concave-convex substrate;
    forming a second conductive material layer on at least one surface of a second flexible concave-convex substrate, wherein an upper surface and a lower surface of the second flexible concave-convex substrate both have a plurality of concave-convex fine structures; and
    patterning the second conductive material layer to form a second touch control electrode so that at least one part of the second touch control electrode is formed on one or more concave-convex fine structures of the second flexible concave-convex substrate; and
    bonding the first flexible concave-convex substrate and the second flexible concave-convex substrate by a third optically clear adhesive layer.

11. The method of claim 10, wherein the first and/or second flexible substrate is formed on a support plate having a plurality of concave-convex fine structures on a surface thereof by a concave-convex template method, and is then peeled off from the support plate to obtain the first and/or second flexible substrate having a plurality of concave-convex fine structures at least on a surface in contact with the support plate.

* * * * *